US008990469B2

(12) United States Patent
Benhard et al.

(10) Patent No.: US 8,990,469 B2
(45) Date of Patent: Mar. 24, 2015

(54) PORTABLE ELECTRONIC DEVICE DOCKING STATION

(75) Inventors: Ryan Gordon Benhard, Newport Beach, CA (US); Ronald DeCamp, Westminster, CA (US)

(73) Assignee: Targus Group International, Inc., Anaheim, CA (US)

( * ) Notice: Subject to any disclaimer, the term of this patent is extended or adjusted under 35 U.S.C. 154(b) by 125 days.

(21) Appl. No.: 13/365,754

(22) Filed: Feb. 3, 2012

(65) Prior Publication Data

US 2012/0203949 A1    Aug. 9, 2012

Related U.S. Application Data

(60) Provisional application No. 61/439,265, filed on Feb. 3, 2011.

(51) Int. Cl.
*G06F 1/00* (2006.01)
*G06F 13/14* (2006.01)
*G06F 13/38* (2006.01)

(52) U.S. Cl.
CPC ........ *G06F 1/00* (2013.01); *G06F 13/14* (2013.01); *G06F 13/38* (2013.01)
USPC ........................................................ 710/303

(58) Field of Classification Search
CPC .......... G06F 13/14; G06F 13/38; G06F 1/00; G06F 1/1632; G06F 1/1626; G06F 13/409; G06F 1/1616; G06F 13/385
USPC ........................................................ 710/303
See application file for complete search history.

(56) References Cited

U.S. PATENT DOCUMENTS

| 5,835,733 A | * | 11/1998 | Walsh et al. ................... 710/303 |
| 5,886,424 A | * | 3/1999 | Kim ................................ 307/64 |
| 6,170,026 B1 | | 1/2001 | Kimura et al. |

(Continued)

FOREIGN PATENT DOCUMENTS

| GB | 2457252 A | * | 8/2009 | ................ G06F 1/16 |
| WO | WO 03030304 A2 | * | 4/2003 | ............. H01R 12/50 |

(Continued)

OTHER PUBLICATIONS

Fink, Thomas, "Toshiba Dynadock V Review", Aug. 9, 2010, Laptop Magazine, retrieved from the Internet on Dec. 21, 2013 at <http://www.laptopmag.com/review/accessories/toshiba-dynadock-v.aspx>, pp. 1-2.*

(Continued)

*Primary Examiner* — Faisal M Zaman
(74) *Attorney, Agent, or Firm* — John R. Thompson; Stoel Rives LLP

(57) ABSTRACT

A universal docking station for portable electronic devices is disclosed. In some embodiments, the docking station may utilize a universal interface to communicatively couple a portable electronic device to one or more inputs, displays, and/or accessory devices. In some embodiments, the universal interface may be a high-speed and/or super-speed universal data interface. In further embodiments, the universal docking station may be configured to provide electrical power to a portable electronic device. By utilizing a universal data interface, the universal docking station may be utilized with any portable electronic device having the universal data interface regardless of the manufacturer of the portable electronic devices.

49 Claims, 4 Drawing Sheets

(56) References Cited

U.S. PATENT DOCUMENTS

| | | | |
|---|---|---|---|
| 6,604,199 B1* | 8/2003 | Yang et al. | 713/300 |
| 7,035,126 B1* | 4/2006 | Lanni | 363/142 |
| 7,103,760 B1* | 9/2006 | Billington et al. | 713/1 |
| 7,643,283 B2* | 1/2010 | Jubelirer et al. | 361/679.41 |
| 7,683,573 B2* | 3/2010 | Nikazm et al. | 320/113 |
| 7,976,337 B1* | 7/2011 | Cortopassi et al. | 439/502 |
| 2002/0119800 A1* | 8/2002 | Jaggers et al. | 455/550 |
| 2003/0084222 A1* | 5/2003 | Wurzburg | 710/303 |
| 2004/0064621 A1* | 4/2004 | Dougherty et al. | 710/303 |
| 2004/0088465 A1* | 5/2004 | Bianchi | 710/303 |
| 2004/0095713 A1* | 5/2004 | Chuang | 361/679 |
| 2004/0116149 A1* | 6/2004 | Yukie et al. | 455/550.1 |
| 2004/0212586 A1* | 10/2004 | Denny, III | 345/156 |
| 2005/0162824 A1 | 7/2005 | Thompson | |
| 2005/0180086 A1* | 8/2005 | Schaefer et al. | 361/154 |
| 2006/0005055 A1* | 1/2006 | Potega | 713/300 |
| 2006/0075286 A1* | 4/2006 | Hodge et al. | 714/5 |
| 2006/0095641 A1* | 5/2006 | Pandit et al. | 710/313 |
| 2006/0161713 A1* | 7/2006 | Belady | 710/303 |
| 2006/0250764 A1 | 11/2006 | Howarth et al. | |
| 2007/0070598 A1* | 3/2007 | Chuang | 361/686 |
| 2007/0101039 A1 | 5/2007 | Rutledge et al. | |
| 2007/0168593 A1* | 7/2007 | Montag et al. | 710/303 |
| 2008/0053770 A1* | 3/2008 | Tynyk | 190/100 |
| 2008/0119241 A1 | 5/2008 | Dorogusker et al. | |
| 2008/0194119 A1* | 8/2008 | Mori | 439/13 |
| 2008/0239681 A1* | 10/2008 | Iida | 361/752 |
| 2009/0066704 A1* | 3/2009 | Daniel et al. | 345/501 |
| 2009/0158423 A1* | 6/2009 | Orlassino et al. | 726/19 |
| 2009/0309748 A1* | 12/2009 | Elgort et al. | 340/686.6 |
| 2010/0066685 A1 | 3/2010 | Cain et al. | |
| 2010/0081473 A1 | 4/2010 | Chatterjee et al. | |
| 2010/0128766 A1 | 5/2010 | Sugita | |
| 2010/0188808 A1* | 7/2010 | Howarth et al. | 361/679.41 |
| 2010/0251361 A1 | 9/2010 | Collopy et al. | |
| 2010/0259213 A1 | 10/2010 | Maharaj | |
| 2010/0295384 A1* | 11/2010 | Kobayashi | 307/154 |
| 2011/0145466 A1* | 6/2011 | Supran et al. | 710/304 |
| 2011/0204843 A1 | 8/2011 | Foster | |
| 2011/0266997 A1* | 11/2011 | Krancher et al. | 320/107 |
| 2012/0034951 A1* | 2/2012 | Jones et al. | 455/556.1 |
| 2012/0054400 A1* | 3/2012 | Iverson et al. | 710/303 |
| 2012/0155013 A1* | 6/2012 | Huang | 361/679.41 |

FOREIGN PATENT DOCUMENTS

| | | | | |
|---|---|---|---|---|
| WO | WO 2008/109193 A1 | | 9/2008 | |
| WO | WO 2013033573 A2 | * | 3/2013 | G06F 1/16 |

OTHER PUBLICATIONS

International Search Report and Written Opinion for PCT/US2012/023717 filed Feb. 3, 2012, and mailed Aug. 30, 2012, 9 pgs.

International Preliminary Report on Patentability for PCT/US2012/023717 filed Feb. 3, 2012, and mailed Aug. 15, 2013, 6 pgs.

International Search Report and Written Opinion for PCT/US2014/017434 filed Feb. 20, 2014, and mailed from International Searching Authority on Jun. 30, 2014, 13 pgs.

Non-Final Office Action for U.S. Appl. No. 13/786,038, filed Mar. 5, 2013 and mailed from USPTO on Sep. 18, 2014, 24 pgs.

* cited by examiner

PORTABLE ELECTRONIC DEVICE DOCKING STATION

RELATED APPLICATIONS

This application claims priority under 35 U.S.C. §119(e) to U.S. Provisional Patent Application No. 61/439,265, filed Feb. 3, 2011, and entitled "PORTABLE ELECTRONIC DEVICE DOCKING SYSTEM," which is herein incorporated by reference in its entirety.

TECHNICAL FIELD

The present disclosure relates generally to portable electronic devices and, more specifically, to a universal docking station for a portable electronic device.

BRIEF DESCRIPTION OF THE DRAWINGS

The written disclosure herein describes illustrative embodiments that are non-limiting and non-exhaustive. Reference is made to certain of such illustrative embodiments that are depicted in the figure(s), in which.

DETAILED DESCRIPTION

Figure 1:
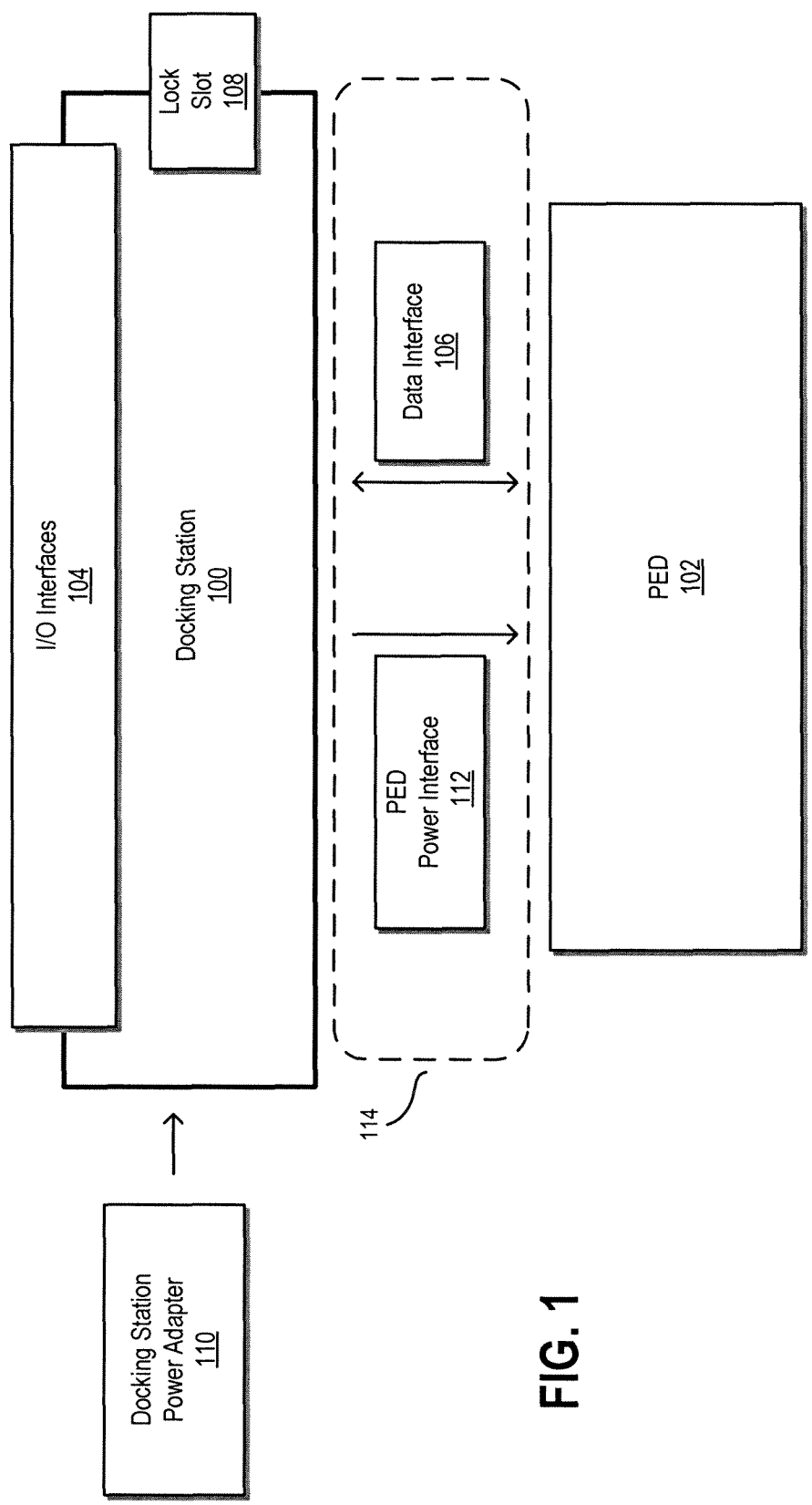
FIG. 1 illustrates a diagram of a universal docking station consistent with embodiments of the present disclosure.

The proliferation of portable electronic devices (PEDs), including notebook computers (e.g., laptops, netbooks, ultrabooks, etc.), tablet computers (e.g., the Apple® iPad™, Amazon® Kindler™, etc.), portable digital assistants (PDAs), and smartphones, has placed more computing power into the hands of users than the computing power of early computers that occupied an entire room. Due to their portability, however, PEDs may not be ideally suited for sustained use over long periods of time. In some instances, PED interfaces may be designed primarily for portability rather than for functionality and ergonomic efficiency. For example, keyboard inputs and displays integrated in a PED device (e.g., a laptop computer) may be sized significantly smaller than keyboard inputs and displays associated with a less-portable system (e.g., a desktop computer). Further, a PED device designer may sacrifice integrating accessory devices in a PED such as, for example, multi-media drives, printers, joysticks, pointing inputs, and the like, for increased portability of the PED.

To increase functionality and/or ergonomic efficiency during use over sustained periods, a PED may be coupled to a docking station capable of interfacing the PED with more functional and ergonomic inputs/outputs and/or displays. For example, a PED may connect to a docking station configured to interface the PED with a large discrete display (e.g., a 24" computer monitor or the like), a full-sized ergonomic keyboard, and a pointing input (e.g., a computer mouse). These inputs/outputs and/or displays may then be used to control and/or interact with the PED.

Conventional docking stations include proprietary interfaces that allow the docking stations to only interface with PEDs manufactured by a particular entity and/or in the same product line. For example, a conventional docking station manufactured by Dell® may only be capable of interfacing with laptop computers manufactured by Dell®, and therefore may not be capable of interfacing with a laptop computer manufactured by Lenovo®. Similarly, a conventional docking station manufactured by Dell® for a certain product line of laptop computers may not be capable of interfacing with a laptop computer manufactured by Dell® in a different product line. Accordingly, a user may not readily switch between PED manufacturer and/or product lines without acquiring new docking stations capable of interfacing with new PED devices.

Embodiments of the present disclosure provide and describe a universal docking station for a PED. In certain embodiments, the universal docking station may utilize a single or multiple universal interface(s), tethered or untethered, to communicatively couple a PED to one or more inputs/outputs, displays, and/or accessory devices. In some embodiments, the universal interface may be a high-speed and/or super-speed universal data interface (e.g., Universal Serial Bus 3.0, SATA, eSATA, FireWire, DisplayPort™, Thunderbolt, Lightingbolt) or the like. In further embodiments, the universal docking station may be configured to provide electrical power to a PED device. In certain embodiments, the universal docking station may be configured to provide electrical power to a PED device via a single or multiple discrete interface(s) or single or multiple cable(s) integrated, tethered or untethered, with the universal interface. By utilizing a universal data interface, the universal docking station may be utilized with any PED device having the universal data interface regardless of the manufacturer of the PED. In certain embodiments, the universal docking station may be configured to provide electrical power to a PED via one or more discrete interfaces integrated, tethered or untethered, with a fixed or proprietary power interface. In some embodiments, by utilizing a fixed or propriety interface, the universal docking station may be utilized with a single, defined platform of PED devices while streamlining the user experience and minimizing additional parts.

Embodiments may be best understood by reference to the drawing(s), wherein like parts are designated by like numerals throughout. It will be readily understood that the components of the present disclosure, as generally described and illustrated in the drawing(s) herein, could be arranged and designed in a wide variety of different configurations. Thus, the following more detailed description of the embodiments of the systems, methods and apparatuses is not intended to limit the scope of the disclosure, but is merely representative of possible embodiments of the disclosure. In some cases, well-known structures, materials, or operations are not shown or described in detail.

FIG. 1 illustrates a diagram of a universal docking station 100 for a PED 102 consistent with embodiments of the present disclosure. The docking station 100 may also be referred to as a hub, a port replicator, an expansion dock, and the like and, as used herein, does not necessarily imply a device which mechanically retains or secures the PED 102 within the docking station 100, although some embodiments of the docking station 100 may have such functionalities. The PED 102 may be any portable electronic device including, for example, a notebook and/or laptop computer, a netbook computer, an ultrabook computer, an electronic book reader (e.g., the Amazon® Kindler™), a smartphone (e.g., the Apple® iPhone™, the Motorola® Droid®, and the BlackBerry® Storm™), and/or a tablet computer (e.g., the Apple® iPad™, the HP® Slate, and the Samsung® Galaxy™ Tablet).

In certain embodiments, the docking station 100 may include a body configured to receive a PED 102, and may further function to retain the PED 102 through a mechanical interface (e.g., a spring loaded mechanical clamp or the like). As shown, the docking station 100 may be configured to receive electrical power from a power adapter 110 configured to removably (i.e., untethered) or permanently (i.e., tethered) connect the docking station 100 to an electrical power supply. In some embodiments, the power adapter 110 may be configured to receive electrical power from a standard electrical utility socket (e.g., a 120V wall socket) and provide this power to the docking station 100. In certain embodiments, the power adapter 110 may include a transformer (not shown) and/or other power conditioning equipment configured to condition (e.g., step down) the electrical power provided to the docking station 100. In certain other embodiments, the power adapter 110 may provide unconditioned electrical power (e.g., not stepped-down) directly to the docking station 100, and the docking station 100 may include a transformer and/or other power conditioning equipment. Electrical power provided to the docking station 100 by power adapter 110 may be provided to the PED 102 via a PED power interface 112.

As illustrated, the docking station 100 may include a lock slot or post 108 configured to allow a user to securely retain the docking station 100 to a secure object (e.g., a desk). In certain embodiments, the lock slot or post 108 may include a locking mechanism (not shown) configured to allow a user to selectively lock the docking station 100 to a secure object via a cable or the like. In certain other embodiments, the lock slot or post 108 may be configured to interface with a cable or the like that includes a locking mechanism separate from the docking station 100.

The PED 102 may be communicatively coupled with the docking station 100 via a data interface 106. In some embodiments, the data interface 106 may be a standard non-proprietary interface that utilizes a widely available communication standard used by multiple PED 102 manufactures. For example, the data interface 106 may utilize standard or derivates of Universal Serial Bus (USB), IEEE 1394 (Firewire), Ethernet, eSata, HDMI, DVI, VGA, LightPeak™, CopperPeak™, ThunderBolt™, DisplayPort™, optical, telephone, and/or other similar communication standards.

The docking station 100 may include one or more input/output (I/O) accessory interfaces 104 configured to communicatively couple one or more accessory devices (not shown) to the docking station 100. For example, the I/O accessory interfaces 104 may be configured to communicatively couple one or more keyboards, pointer inputs (e.g., computer mice), disk drives, cameras, microphones, printers, scanners, speakers, music players, displays and the like to the docking station 100.

Accessory devices communicatively coupled to the docking station 100 via I/O accessory interfaces 104 may communicate with the PED 102 via the data interface 106. In certain embodiments, the data interface 106 may be a high-speed, SuperSpeed, HyperSpeed, or the like data interface capable of communicatively coupling the PED 102 with one or more accessory devices via the I/O accessory interfaces 104 of the docking station 100. In preferred embodiments, the data interface 106 may utilize the USB 3.0 communication standard, allowing a connected PED 102 to output high-quality video to a single display or multiple displays (not shown) coupled to one of I/O accessory interfaces 104 and to receive input from one or more input devices (e.g., a pointer input, a keyboard, a joystick, and the like). Further, the data interface 106 may allow a connected PED 102 to interface with communicatively coupled storage devices, printers, external hard drives, flash drives, scanners, digital cameras, digital video recorders, MP3 players, iPods, iPhones, Blackberries, and the like. In this manner, the docking station 100 allows any PED 102 with a universal interface capable of utilizing the data interface 106 to communicate with one or more accessories coupled to the docking station 100 via the I/O accessory interfaces 104. This functionality may allow the docking station 100 to be used by multiple PEDs 102 from different manufacturers and operating system platforms.

As shown in FIG. 1, the PED power interface 112 and data interface 106 may be separate interfaces (e.g., separate cables). In some embodiments, however, the functionality of the PED power interface 112 and data interface 106 may be embodied in a single interface 114 (e.g., a single cable) capable of providing both power to the PED 102 from the docking station 100 and communicatively coupling the PED 102 with the docking station 100. In certain embodiments, the PED power interface 112 and data interface 106 may be separate interfaces that are physically bundled together for simplicity.

In some embodiments, the docking station 100 may include a reset button (not shown) configured to reset the data interface 106 and/or one or more of I/O accessory interfaces 104. In certain embodiments, resetting the data interface 106 and/or one or more of I/O accessory interfaces 104 may be functionally equivalent to temporarily disconnecting then reconnecting the PED 102 from the data interface 106 and/or accessory devices from the I/O accessory interfaces 104. The docking station 100 may further include a power button (not shown) configured to control the power delivered to the PED 102. In certain embodiments, the power button may communicatively interface with the PED 102 to enable a controlled powerup, boot-up shutdown, power down, and/or hibernation of the PED 102 when the power button is pressed. Further, in some embodiments, the docking station 100 may be configured to store (e.g., bundle) other components and/or accessories used with the docking station 100 including, for example, cables associated with data interface 106, power tips associated with data interface 106, I/O accessory interfaces 104, PED power interface 112, and power adapter 110.

Figure 2:
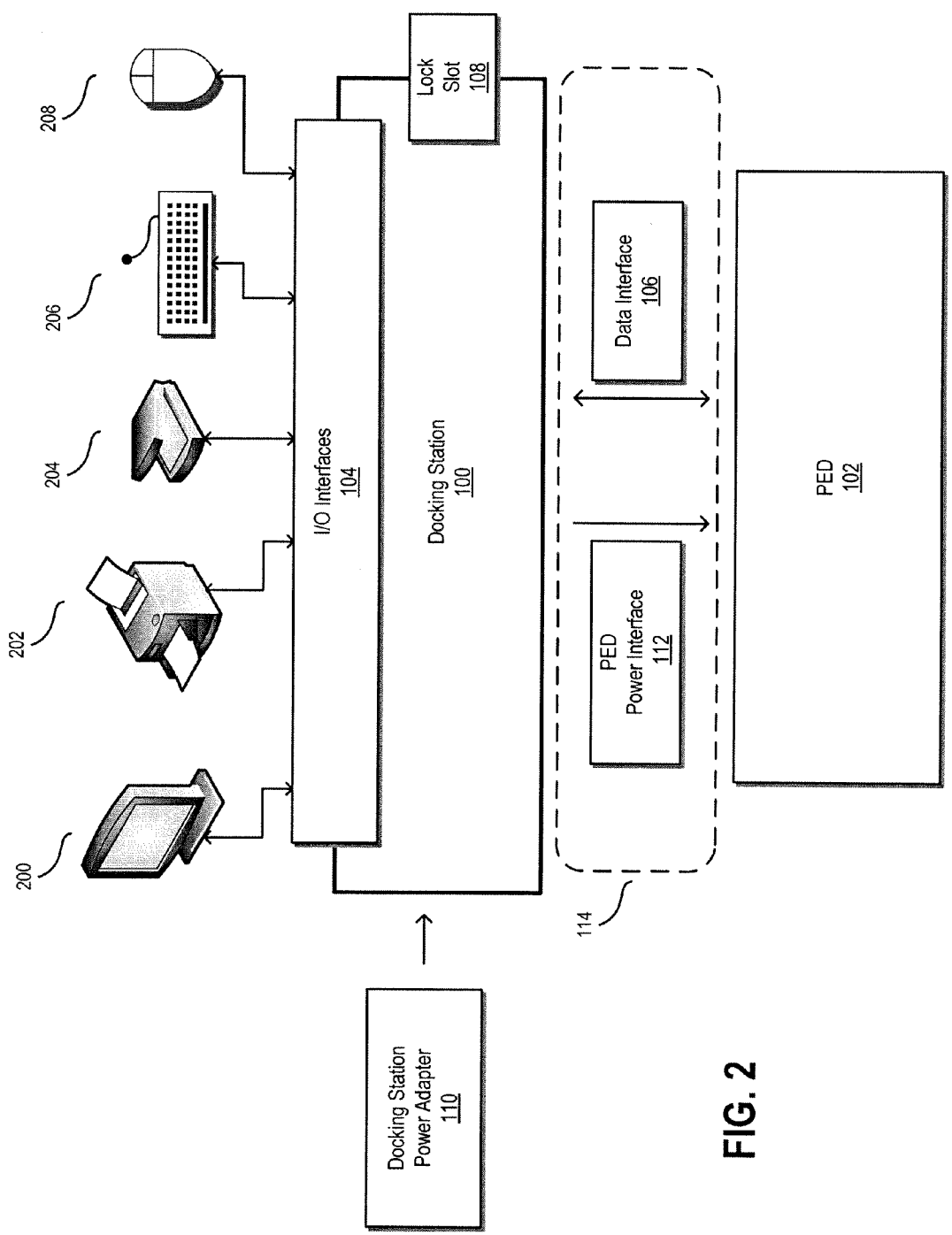
FIG. 2 illustrates a diagram of a universal docking station communicatively coupled with accessory devices consistent with embodiments of the present disclosure.

FIG. 2 illustrates a diagram of a universal docking station 100 communicatively coupled with accessory devices 200-208 consistent with embodiments of the present disclosure. As shown, the docking station 100 may be communicatively coupled via I/O accessory interfaces 104 with one or more accessory devices including but not limited to, for example, a display 200, a printer 202, a scanner, 204, a keyboard 206, and a pointer input 208. In turn, the PED 102 may be communicatively coupled with the docking station 100 via the data interface 106 which, in some embodiments, may be a high-speed, SuperSpeed, HyperSpeed, or the like data interface 106. The PED 102 may control and/or receive input from accessory devices 200-208 coupled to the docking station 100 via the data interface 106, the docking station 100, and I/O accessory interfaces 104. For example, the PED 102 may output high-quality video to the display(s) 200, while simultaneously outputting data to the printer 202 or receiving data from the scanner 204, the keyboard 206, and the pointer input 208.

Figure 3:
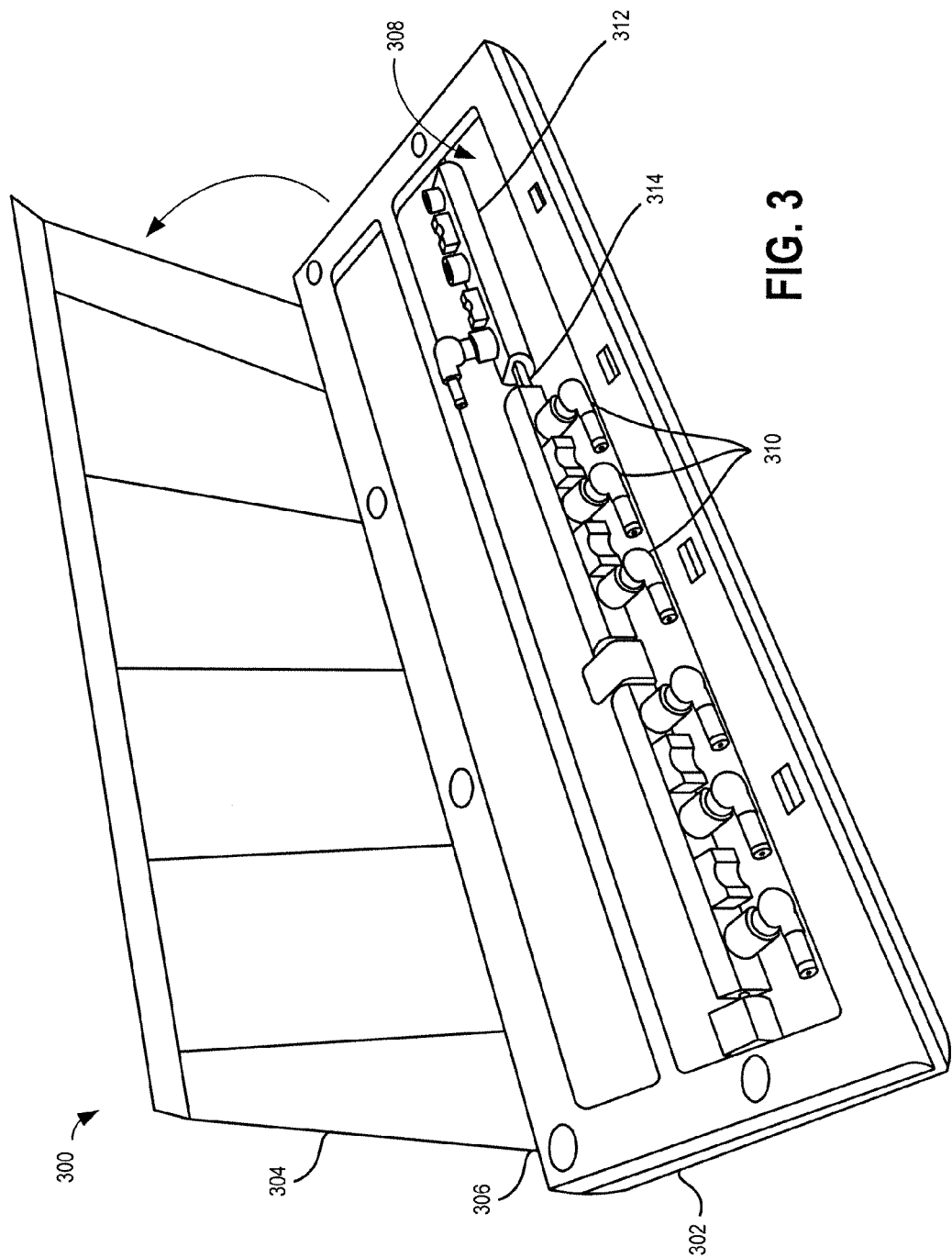
FIG. 3 illustrates an isometric perspective view of a docking station consistent with embodiments of the present disclosure.

FIG. 3 illustrates an isometric perspective view of a docking station 300 consistent with embodiments of the present disclosure. The illustrated docking station 300 may incorporate certain features of the docking station 100 illustrated and described in reference to FIGS. 1-2, although all of such features may not be specifically illustrated in FIG. 3. The docking station 300 may include a main body 302 and a cover 304 pivotally connected along an edge of the main body 302 via a hinge 306, although other configurations of the main body 302, cover 304, and hinge 306 may be utilized. Fir example, in certain configurations, the main body 302, the cover 304, and/or the hinge 306 may be detachable. The main body 302 and cover 304 may comprise plastic, glass, metal, any/or any other suitable material.

In certain embodiments, the main body 302 may define one or more compartments 308. The one or more compartments 308 may be configured to store (e.g., bundle) one or more components used with the docking station 300. For example, the one or more compartments may be configured to store, house, and/or contain cables associated with any data interfaces, power tips 310 associated with power interfaces, tips associated with data interfaces, I/O accessory interfaces, PED power interfaces, and/or any power adapters or other components used with the docking station 300. The cover 304 may be configured to cover and/or protect one or more components stored in the one or more compartments 308 when closed against the main body 302 about the hinge 306. In certain embodiments, the cover 304 may be configured to snap closed against the main body 302 about the hinge 306 using any suitable mechanical, magnetic, or other closure mechanism.

One or more accessory cradles or clips 312 configured to securely retain stored components may be included in the compartments 308 defined by the main body 302. For example, as illustrated, power tips 310 associated with power interfaces may be secured by the accessory cradles or clips 312 within the compartments 308. In certain embodiments, the accessory cradles or clips 312 may be configured to secure stored components via a compression mechanism, although any other method of mechanical securement may be utilized. In certain embodiments, the accessory cradles or clips 312 may be configured to pivot about a shaft 315 or other rotational mechanism or removable mechanism, thereby allowing the accessory cradle 312 to be rotated in and out of or removed from the compartments 308 and for easier access to any stored components secured therein.

Figure 4:
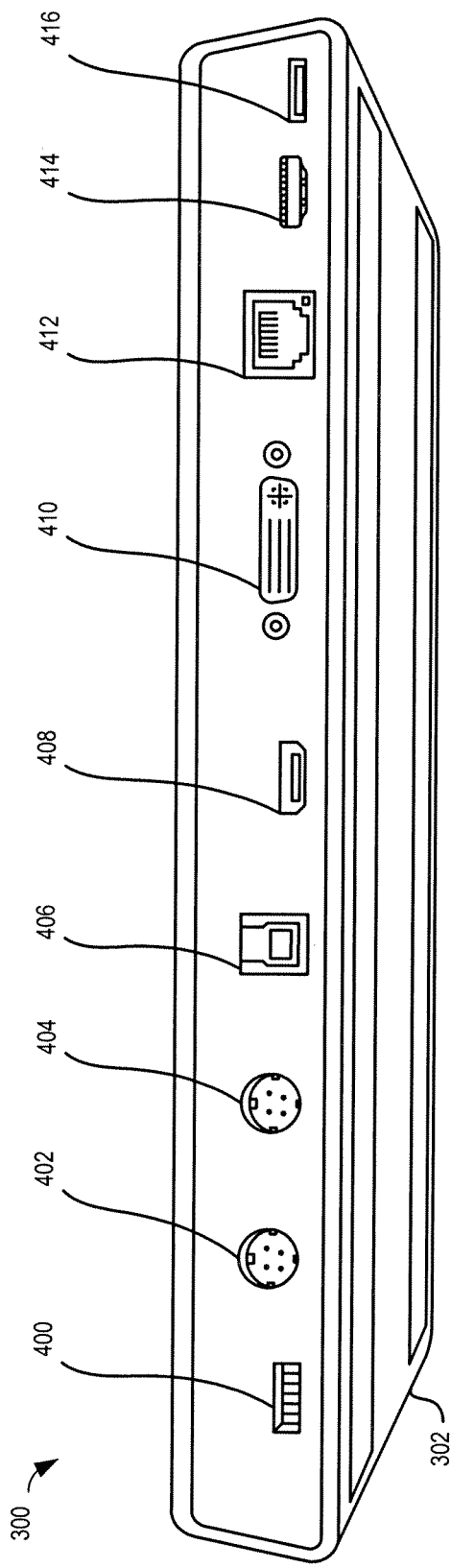
FIG. 4 illustrates an rear view of a docking station consistent with embodiments of the present disclosure.

FIG. 4 illustrates a rear view of a docking station 300 consistent with embodiments of the present disclosure. The illustrated docking station 300 may incorporate certain features of the docking station 100 illustrated and described in reference to FIGS. 1-2, although all of such features may not be specifically illustrated in FIG. 4. As shown, the docking station 300 may include one or more I/O interfaces and/or data interfaces 406-416 and one or more PED power interfaces 400-404. Utilizing the illustrated interfaces 400-416, certain functionalities of the docking station 100 illustrated and described in reference to FIGS. 1-2, may be implemented.

It will be understood by those having skill in the art that changes may be made to the details of the above-described embodiments without departing from the underlying principles presented herein. For example, any suitable combination of various embodiments, or the features thereof, is contemplated.

Any methods disclosed herein comprise one or more steps or actions for performing the described method. The method steps and/or actions may be interchanged with one another. In other words, unless a specific order of steps or actions is required for proper operation of the embodiment, the order and/or use of specific steps and/or actions may be modified.

Throughout this specification, any reference to "one embodiment," "an embodiment," or "the embodiment" means that a particular feature, structure, or characteristic described in connection with that embodiment is included in at least one embodiment. Thus, the quoted phrases, or variations thereof, as recited throughout this specification are not necessarily all referring to the same embodiment.

Similarly, it should be appreciated that in the above description of embodiments, various features are sometimes grouped together in a single embodiment, figure, or description thereof for the purpose of streamlining the disclosure. This method of disclosure, however, is not to be interpreted as reflecting an intention that any claim require more features than those expressly recited in that claim. Rather, inventive aspects lie in a combination of fewer than all features of any single foregoing disclosed embodiment. It will be apparent to those having skill in the art that changes may be made to the details of the above-described embodiments without departing from the underlying principles set forth herein.

What is claimed is:

1. A docking station for a laptop computer, the docking station comprising:
   a body without a user input or output device;
   a power receiving interface coupled to the body and configured to receive electrical power from a power adapter receiving and adapting power from a wall socket source that supplies power;
   an accessory interface coupled to the body and configured to simultaneously communicatively couple the docking station with a plurality of user interchangeable accessory devices to enable non-audio, bi-directional data communication between the laptop computer and the user interchangeable accessory devices;
   a standardized non-proprietary, universal data interface coupled to the body and configured to operate according to a universal data communication standard to communicatively couple the docking station with the laptop computer and in electrical communication with the accessory interface to enable non-audio, bi-directional data communication between the laptop computer and the user interchangeable accessory devices and to enable control of the user interchangeable accessory devices by the laptop computer, the standardized non-proprietary universal data interface comprising a first port and a first cable removably coupled to the first port, the first cable configured to communicate with the laptop computer to enable non-audio, bi-directional data communications between the laptop computer and the universal data interface; and
   a standardized power providing interface in electrical communication with the power receiving interface and configured to operate according to a universal power communication standard to deliver electrical power to the laptop computer, the standardized power providing interface comprising:
   a second port;
   a second cable removably coupled to the second port;
   a proprietary tip removably coupled to the second cable,
   wherein the second cable and removable proprietary tip are configured to enable power communication between the laptop computer and the power receiving interface; and
   wherein the power providing interface and the second cable are configured to provide power sufficient for the laptop computer.

2. The docking station of claim 1, wherein the universal data interface and the power providing interface are integrated into a single universal interface.

3. The docking station of claim 1, wherein the body is further configured to mechanically retain the laptop computer.

4. The docking station of claim 3, wherein the body further comprises a spring loaded mechanical clamp configured to mechanically retain the laptop computer.

5. The docking station of claim 1, wherein the universal data interface further comprises a high speed interface.

6. The docking station of claim 1, wherein the universal data interface is configured to support the USB communication standard.

7. The docking station of claim 1, wherein the universal data interface comprises an interface selected from the group comprising: a high speed USB interface, an IEEE 1394 interface, a LightPeak™ interface, a CopperPeak™ interface, an Ethernet interface, an eSata interface, an HDMI interface, a DVI interface, a VGA interface, a ThunderBolt™ interface, and a Display Port interface.

8. The docking station of claim 1, wherein the universal data interface is configured to support a communication standard used by a plurality of manufacturers of portable electronic devices.

9. The docking station of claim 1, wherein the docking station further includes a reset button configured to reset the universal data interface.

10. The docking station of claim 9, wherein the reset button is further configured to reset the accessory interface.

11. The docking station of claim 1, wherein the docking station further includes a power button configured to control the electrical power delivered to the laptop computer by the power providing interface.

12. The docking station of claim 1, wherein the body is configured to store cables associated with the accessory interface.

13. The docking station of claim 1, wherein the body is configured to store cables associated with the power receiving interface.

14. The docking station of claim 1, wherein the docking station includes a lock slot configured to secure the body to a secure object.

15. The docking station of claim 14, wherein the lock slot includes a locking mechanism configured to selectively lock the body to the secure object.

16. The docking station of claim 15, wherein the locking mechanism is further configured to selectively lock the body to the secure object using a cable.

17. The docking station of claim 1, wherein the body is configured to store accessories associated with the portable electronic device.

18. The docking station of claim 1, wherein the accessory interface comprises one or more user interchangeable ports.

19. The docking station of claim 1, wherein the accessory interface comprises a port configured to communicatively couple with a non-audio input/output device.

20. The docking station of claim 1, wherein the accessory interface comprises a port configured to communicatively couple with an input device.

21. The docking station of claim 1, wherein the accessory interface comprises a port configured to communicatively couple with a user viewable display.

22. The docking station of claim 1, wherein the accessory interface comprises a port configured to communicatively couple with a printer.

23. The docking station of claim 1, wherein the accessory interface comprises a plurality of user interchangeable ports.

24. The docking station of claim 1, wherein the body is configured to store power tips to enable communicative coupling with the universal interface.

25. A docking station for a laptop computer, the docking station comprising:

a body without a user input or output device;

a power receiving interface coupled to the body and configured to receive electrical power from a power adapter receiving and adapting power from a socket source that supplies power;

an accessory interface coupled to the body and configured to simultaneously communicatively couple the docking station with a plurality of user interchangeable accessory devices to enable non-audio, bi-directional data communication between the laptop computer and the user interchangeable accessory devices;

a standardized non-proprietary, universal data interface coupled to the body and configured to operate according to a universal data communication standard to communicatively couple the docking station with the laptop computer and in electrical communication with the accessory interface to enable non-audio, bi-directional data communication between the laptop computer and the user interchangeable accessory devices and to enable control of the user interchangeable accessory devices by the laptop computer, the standardized non-proprietary universal data interface comprising a first port and a first cable removably coupled to the first port, the first cable configured to communicate with the laptop computer to enable non-audio, bi-directional data communications between the laptop computer and the universal data interface; and a standardized power providing interface separate from the standardized non-proprietary, universal data interface and in electrical communication with the power receiving interface and configured to operate according to a universal power communication standard to deliver electrical power to the laptop computer, the standardized power providing interface comprising:

a second port;

a second cable removably coupled to the second port;

a proprietary tip removably coupled to the second cable, wherein the second cable configured to enable power communication between the laptop computer and the power receiving interface to thereby enable power communication from the socket source to the laptop computer.

26. A docking station for a laptop computer, the docking station comprising:

a body without a user input or output device;

a power receiving interface coupled to the body and configured to receive electrical power from a power adapter receiving and adapting power from a wall socket source that supplies power;

an accessory interface coupled to the body and configured to simultaneously communicatively couple the docking station with a plurality of user interchangeable accessory devices to enable non-audio, bi-directional data communication between the laptop computer and the user interchangeable accessory devices;

a standardized non-proprietary, universal data interface coupled to the body and configured to operate according to a universal data communication standard to communicatively couple the docking station with the laptop computer and in electrical communication with the accessory interface to enable non-audio, bi-directional data communication between the laptop computer and the user interchangeable accessory devices and to enable control of the user interchangeable accessory devices by the laptop computer, the standardized non-proprietary universal data interface comprising a first port and a first cable removably coupled to the first port, the first cable configured to communicate with the laptop computer to enable non-audio, bi-directional data communications between the laptop computer and the universal data interface; and a standardized power providing interface in electrical communication with the power receiving interface and configured to operate according to a universal power communication standard to deliver electrical power to the laptop computer, the standardized power providing interface comprising:

a second port;

a second cable removably coupled to the second port;

a non-universal tip removably coupled to the second cable, wherein the second cable and removable non-universal tip are configured to enable power communication between the laptop computer and the power receiving interface; and wherein the power providing interface and the second cable are configured to provide power sufficient for the laptop computer.

27. The docking station of claim 26, wherein the universal data interface and the power providing interface are integrated into a single universal interface.

28. The docking station of claim 26, wherein the body is further configured to mechanically retain the laptop computer.

29. The docking station of claim 28, wherein the body further comprises a spring loaded mechanical clamp configured to mechanically retain the laptop computer.

30. The docking station of claim 26, wherein the universal data interface further comprises a high speed interface.

31. The docking station of claim 26, wherein the universal data interface is configured to support the USB communication standard.

32. The docking station of claim 26, wherein the universal data interface comprises an interface selected from the group comprising: a high speed USB interface, an IEEE 1394 interface, a LightPeak™ interface, a CopperPeak™ interface, an Ethernet interface, an eSata interface, an HDMI interface, a DVI interface, a VGA interface, a ThunderBolt™ interface, and a Display Port interface.

33. The docking station of claim 26, wherein the universal data interface is configured to support a communication standard used by a plurality of manufacturers of portable electronic devices.

34. The docking station of claim 26, wherein the docking station further includes a reset button configured to reset the universal data interface.

35. The docking station of claim 34, wherein the reset button is further configured to reset the accessory interface.

36. The docking station of claim 26, wherein the docking station further includes a power button configured to control the electrical power delivered to the laptop computer by the power providing interface.

37. The docking station of claim 26, wherein the body is configured to store cables associated with the accessory interface.

38. The docking station of claim 26, wherein the body is configured to store cables associated with the power receiving interface.

39. The docking station of claim 26, wherein the docking station includes a lock slot configured to secure the body to a secure object.

40. The docking station of claim 39, wherein the lock slot includes a locking mechanism configured to selectively lock the body to the secure object.

41. The docking station of claim 40, wherein the locking mechanism is further configured to selectively lock the body to the secure object using a cable.

42. The docking station of claim 26, wherein the body is configured to store accessories associated with the portable electronic device.

43. The docking station of claim 26, wherein the accessory interface comprises one or more user interchangeable ports.

44. The docking station of claim 26, wherein the accessory interface comprises a port configured to communicatively couple with a non-audio input/output device.

45. The docking station of claim 26, wherein the accessory interface comprises a port configured to communicatively couple with an input device.

46. The docking station of claim 26, wherein the accessory interface comprises a port configured to communicatively couple with a user viewable display.

47. The docking station of claim 26, wherein the accessory interface comprises a port configured to communicatively couple with a printer.

48. The docking station of claim 26, wherein the accessory interface comprises a plurality of user interchangeable ports.

49. The docking station of claim 26, wherein the body is configured to store power tips to enable communicative coupling with the universal interface.

* * * * *